United States Patent
Corvasce et al.

(10) Patent No.: US 6,656,801 B2
(45) Date of Patent: Dec. 2, 2003

(54) METHOD OF FABRICATING A FERROELECTRIC STACKED MEMORY CELL

(75) Inventors: Chiara Corvasce, Via Pacini (IT); Raffaele Zambrano, Via Petrone (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/911,637

(22) Filed: Jul. 23, 2001

(65) Prior Publication Data

US 2002/0008269 A1 Jan. 24, 2002

Related U.S. Application Data

(62) Division of application No. 09/365,178, filed on Aug. 2, 1999.

(30) Foreign Application Priority Data

Apr. 30, 1999 (IT) ........................................ TO99A0356

(51) Int. Cl.$^7$ ............................................ H01L 21/336
(52) U.S. Cl. ...................... 438/279; 438/250; 438/253; 438/3; 257/296
(58) Field of Search ................................ 438/241, 279, 438/250, 251, 386, 396, 240, 669, 712, 3; 257/296, 303

(56) References Cited

U.S. PATENT DOCUMENTS

| | | | |
|---|---|---|---|
| 5,350,705 A | * 9/1994 | Brassington et al. | 257/295 |
| 5,418,388 A | * 5/1995 | Okudaira et al. | 257/303 |
| 5,519,237 A | 5/1996 | Itoh et al. | 257/306 |
| 5,796,133 A | 8/1998 | Kwon et al. | 257/295 |
| 5,796,136 A | * 8/1998 | Shinkawata | 365/149 |
| 5,955,758 A | 9/1999 | Sandhu et al. | 257/306 |
| 6,028,361 A | 2/2000 | Ooishi | 257/774 |
| 6,063,656 A | 5/2000 | Clampitt | 438/239 |

OTHER PUBLICATIONS

Amanuma, K. et al., "Capacitor–on–Metal/Via–stacked–Plug (CMVP) Memory Cell for 0.25um CMOS Embedded Fe RAM", *IEEE*, 1998, pp. 363–366.

Yamazaki, T., et al., "Advanced 0.5um FRAM Device Technology with Full Compatibility of Half–Micron CMOS Logic device", *Advanced Process Integration Department, Fujitsu Limited*. (4 pages).

Takashima, D. et al., "A Sub–40ns Random–Access Chain FRAM Architecture with a 7ns Cell–Plate–Line Drive," *IEEE International Solid–State Circuits Conference*, 1999, pp. 102–103.

Jones, Robert E. Jr., "Integration of ferroelectric nonvolatile memories," *Solid State Technology*, Oct. 1997, pp. 201–210.

* cited by examiner

*Primary Examiner*—Stephen D. Meier
*Assistant Examiner*—Khanh Duong
(74) *Attorney, Agent, or Firm*—Lisa K. Jorgenson; Robert Iannucci; Seed IP Law Group PLLC

(57) ABSTRACT

The cells of the stacked type each comprise a MOS transistor formed in an active region of a substrate of semiconductor material and a capacitor formed above the active region; each MOS transistor has a first and a second conductive region and a control electrode and each capacitor has a first and a second plate separated by a dielectric region material, for example, ferroelectric one. The first conductive region of each MOS transistor is connected to the first plate of a respective capacitor, the second conductive region of each MOS transistor is connected to a respective bit line, the control electrode of each MOS transistor is connected to a respective word line, the second plate of each capacitor is connected to a respective plate line. The plate lines run perpendicular to the bit line and parallel to the word lines. At least two cells adjacent in a parallel direction to the bit lines share the same dielectric region material. In this way, the manufacturing process is not critical and the size of the cells is minimal.

19 Claims, 3 Drawing Sheets

METHOD OF FABRICATING A FERROELECTRIC STACKED MEMORY CELL

CROSS-REFERENCE TO RELATED APPLICATION

This application is a divisional of allowed U.S. patent application Ser. No. 09/365,178, filed Aug. 2, 1999.

TECHNICAL FIELD

The present invention refers to a stacked type of memory cell structure. In particular, the memory cell described is of the ferroelectric non-volatile type, but the same structure can be used for DRAM cells.

BACKGROUND OF THE INVENTION

As is known and shown in FIG. 1, a ferroelectric cell 1 is composed of a MOS transistor 2 and a capacitor 3 having, as a dielectric, a ferroelectric material, for example PZT ($PbZr_{1-x}Ti_xO_3$, perovskite) or SBT ($SrBi_2Ta_2O_9$, layered perovskite). In detail, in the ferroelectric cell 1, the NMOS-type transistor 2 has a source terminal 4 connected to a bit line BL, a gate electrode 5 connected to a word line WL and a drain terminal 6 connected to a first plate 7 of the capacitor 3. A second plate 8 of the capacitor 3 is connected to a plate line PL.

The cell is capable of storing binary information thanks to the hysteresis characteristics of the ferroelectric material which is sandwiched between the plates 7 and 8 and which, when there are no applied voltages, can assume two bias states depending on the sign of previously-applied voltage across the capacitor 3 terminals.

All currently-known ferroelectric cells can be classified into two families: strapped cells and stacked cells.

In strapped cells, an embodiment of which is shown in FIG. 2, the capacitor 3 is constructed above a field oxide region 10 that delimits an active area 11 of the substrate 12 in which the conductive regions (source 13 and drain 14) of the transistor 2 are formed. In detail, the first plate 7 of the capacitor 3 is here placed on top and is made of a square- or rectangular-shaped region of conductive material (for example, platinum), connected to the drain region 14 of the transistor 2 through a metallic connection line 16; the second plate 8 of the capacitor 3 is here placed underneath and is made by a band of conductive material (for example, platinum again) which runs perpendicular to the drawing plane and forms a plate line PL, connected to other capacitors of adjacent cells; a dielectric region 17, of ferroelectric material, is sandwiched between the first plate 7 and the second plate 8. The gate electrode 5 of the transistor 2 is made of a band of polycrystalline silicon which runs perpendicular to the drawing plane and forms a word line WL.

In stacked cells, an embodiment of which can be seen in FIG. 3, the capacitor 3 is constructed above the active area 11, directly above the drain region 14 of the transistor 2. In this case, the first plate 7 of the capacitor 3 is placed underneath and is made by a square- or rectangular-shaped region of conductive material (for example, platinum) connected to the drain region 14 through a contact 23 formed in an opening of a protective layer 24 (for example BPSG) and the second plate 8, of conductive material, is placed above and is connected to a metalization band 25 defining the plate line PL.

A titanium/titanium nitride region 26 runs below the first plate 7 to help the adhesion of the first plate 7 of the capacitor 3 on the protective layer 24.

The architecture of a array 28 of ferroelectric stacked or strapped cells 1 is shown in FIG. 4. It will be noted that the ferroelectric cells 1 are placed on rows and columns and are coupled so that the cell pairs 27 are placed parallel to bit lines BL; the transistors 2 of each cell pair 27 have common source regions, connected to the same bit line BL; and the capacitors 3 belonging to the cell pairs 27 adjacent in a parallel direction to the bit lines BL are connected to adjacent plate line pairs PL.

Ferroelectric stacked cells 1 are currently preferred, since they are the only ones capable of meeting the scalability requirements of new CMOS technologies. In stacked cells, the layout rules on the capacitor 3 design are crucial for the optimization of the cell.

SUMMARY OF THE INVENTION

There are therefore several known embodiments for stacked cells, apart from that shown in FIG. 3, in which both plates 7, 8 and dielectric region 17 are defined using a single mask and forming the plate line PL via a special metallic band. For example, according to another known arrangement, the first (lower) electrode 7 is formed by a separately-shaped conductive region, while the dielectric region 17 and the second (upper) electrode 8 are mutually aligned and shaped using a single mask.

In all these cases, the connection of at least one of the plates 7, 8 with the same mask used for the connection of the ferroelectric material composing the dielectric region 17 is critical; for example, during connection, slightly volatile components are formed, and these can be redeposited along the capacitor edge and damage its active zone, causing a decay in the ferroelectric properties of the capacitor, with an increase in edge losses and lower voltage strength.

On the other hand, the separate definition of the three parts constituting the capacitor 3 (first and second plates 7, 8 and dielectric region 17), which would allow the problem presented by current manufacturing processes to be solved, causes an increase in overall dimensions that is in conflict with present trends towards miniaturization. In fact, in making definition masks, account must be taken of both manufacturing tolerances (at present, with a 0.35 μm process, equal to 0.2 μm) and the minimum distances between the lower adjacent plates and the upper adjacent plates (for example, equal to 0.4 μm). In particular, with the conditions given above, it would be necessary for the lower plate 7 to be wider, with respect to the dielectric region 7, by an amount at least equal to the manufacturing tolerance (at least 0.2 μm) on each side; similarly, it would be necessary for the dielectric region 17 to be wider, with respect to the upper plate 8, by the same amount; therefore, taking into account the minimum distance between the lower plates 7, the resulting overall dimensions for the capacitors 3 and consequently for the ferroelectric cells 1 are excessive.

An object the present invention is making a stacked memory cell, without the described disadvantages. According to the present invention, a stacked memory cell is realized as claimed in Claim 1.

In practice, according to the invention, the dielectric regions of at least two adjacent cells in the direction of the bit lines are no longer separate. In particular, the dielectric region 17 can be continuous and shared between the two adjacent capacitors belonging to pairs of adjacent cells. In this way, the layout definition rules for capacitor scalability are given only by the distance between two lower adjacent electrodes and by the lateral space (enclosure) between upper electrode and lower electrode. This allows, with the same cell area, maximizing the working area of the capacitor compared with the layout of the arrangement where three different masks for definition of the capacitor are used and the dielectric region is divided between adjacent cells in the direction of the bit lines. This causes an increase in signal amplitude (proportional to the active area of the capacitor) supplied by each cell to the sense amplifier during reading. Alternatively, it is possible to obtain a reduction in the area occupied by the ferroelectric cells.

BRIEF DESCRIPTION OF THE DRAWINGS

For a better understanding of the invention, an embodiment thereof will now be described, merely as a non-limiting example and with reference to the enclosed drawings, in which.

DETAILED DESCRIPTION OF THE INVENTION

Figure 5:
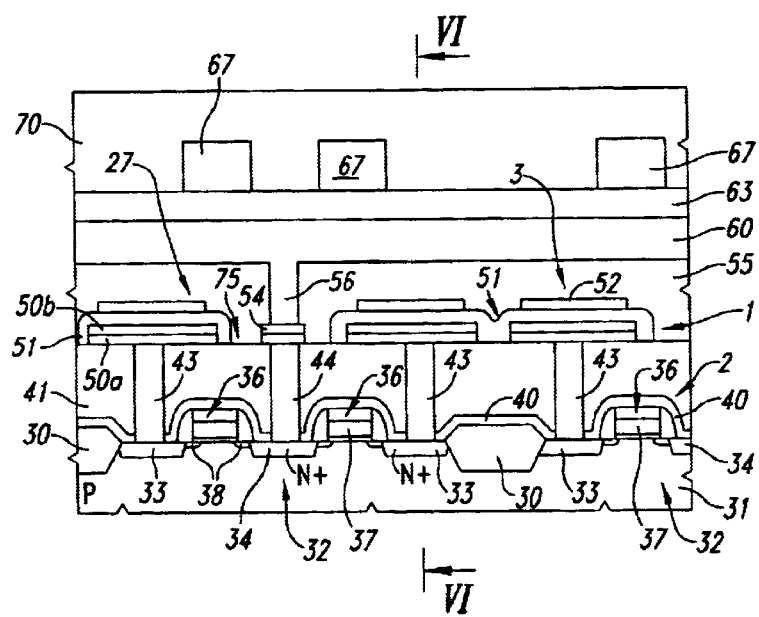
FIG. 5 shows a cross-section through a slice of semiconductor material in which cells have been constructed according to the invention, taken along section line V—V in FIG. 7.
Figure 6:
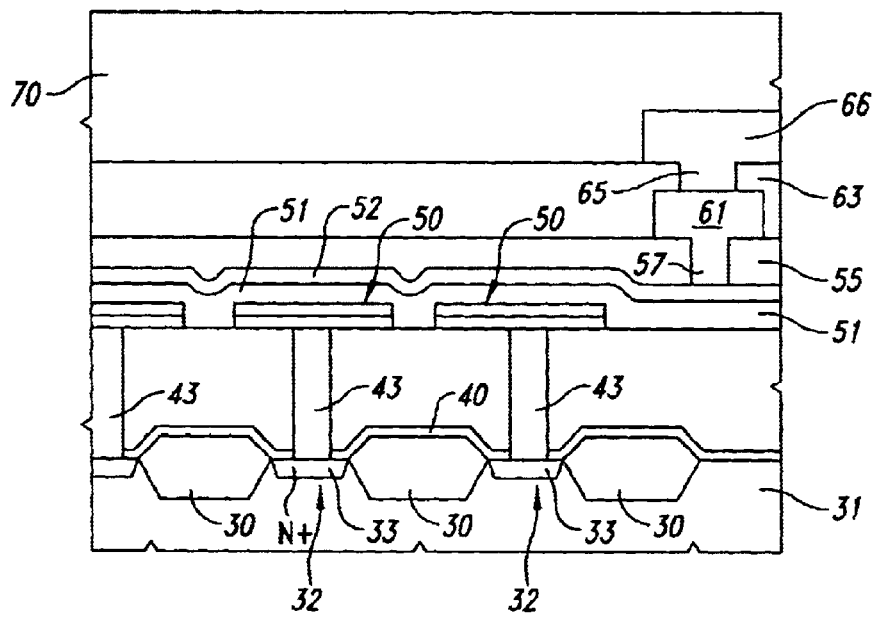
FIG. 6 shows a transverse section of ferroelectric cells according to the invention, taken along section line VI—VI in FIG. 5.
Figure 7:
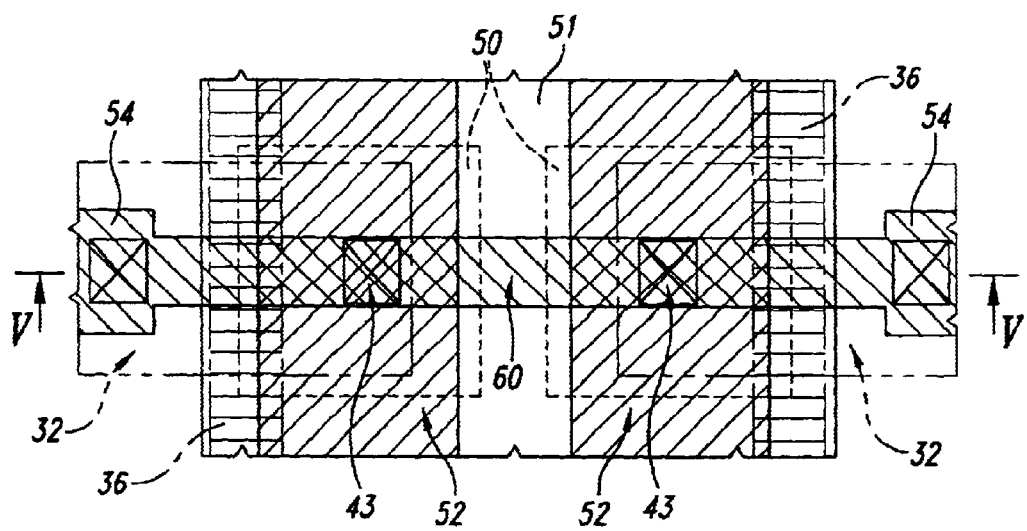
FIG. 7 shows the layout of two cells adjacent to each other, according to the invention.

FIGS. 5–7 show stacked cells 1 constructed according to the invention. The present description refers to ferroelectric cells in particular, without being restricted to these.

In detail, FIG. 5 shows a pair of cells 27 and a single ferroelectric cell 1 adjacent to the pair of cells 27 in the direction of the bit lines (horizontal direction in FIG. 5). Pairs of adjacent cells 27 are insulated from each other by a thick oxide layer 30 (field oxide) which delimits, inside a P-type substrate 31, active areas 32 in which two drain regions 33 and a common $N^+$ type source region 34 are formed. In a known way, gate electrodes 36 are formed above the substrate 31 and are insulated therefrom by a thin oxide layer 37. The gate electrodes 36 are preferably made by bands comprising a double layer of polycrystalline silicon and tungsten silicide running perpendicular to FIG. 5 and defining word lines; the gate electrodes 36 are also laterally flanked by oxide spacers 38.

Less doped drain extension regions 39 are formed in the substrate 31 below spacers 38 and a protective oxide layer 40 covers the surface of the substrate 31.

A first insulating layer 41 (for example, made of Boron Phosphorous Silicon Glass, or BPSG) runs above the protective oxide layer 40 and has openings into which run first and second contacts 43, 44 made of conductive material, for contacting the drain regions 33 and, respectively, the source regions 34.

Figure 1:
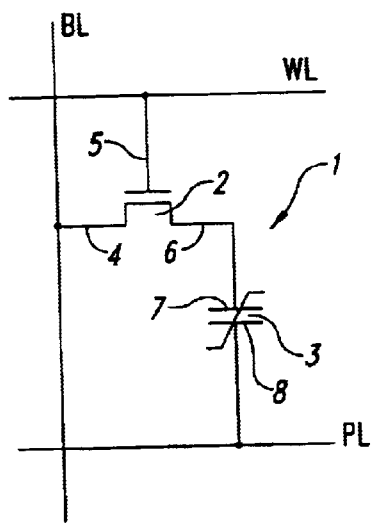
FIG. 1 shows the equivalent electrical diagram of a known ferroelectric cell.
Figure 2:
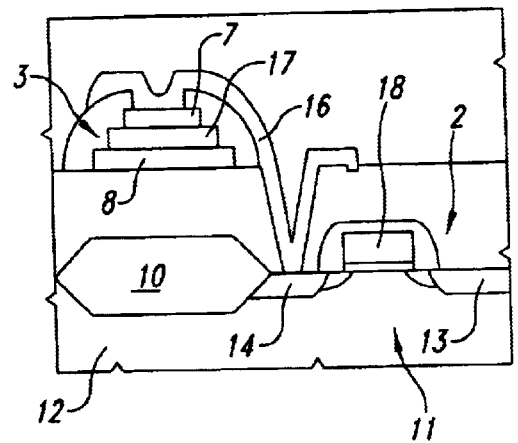
FIG. 2 shows a cross-section through a first known type of ferroelectric cell.
Figure 3:
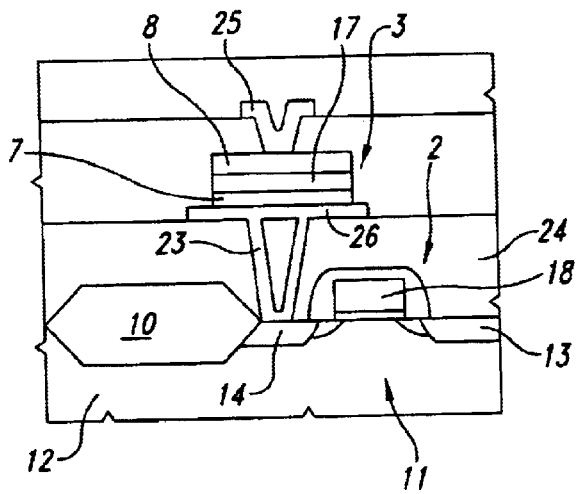
FIG. 3 shows a cross-section through a second known type of ferroelectric cell.
Figure 4:
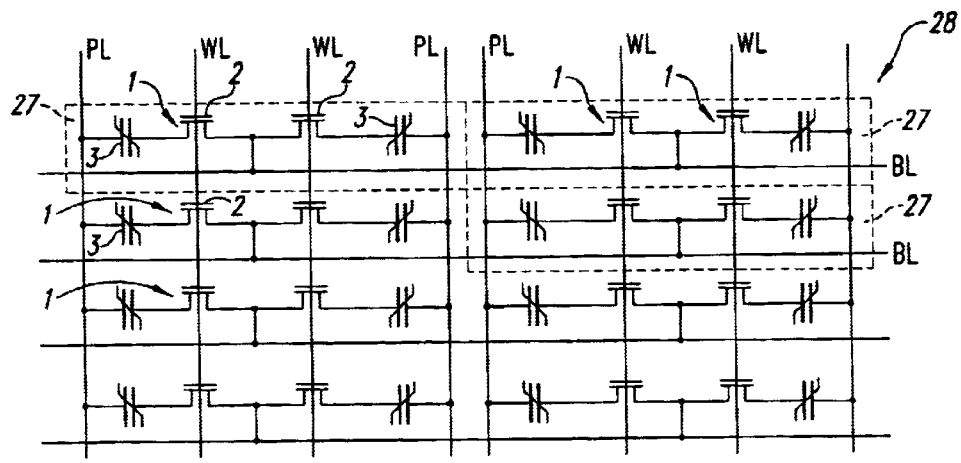
FIG. 4 shows the known architecture of a memory cell array of the type under consideration.

Above the first insulating layer 41, there are formed lower plates 50 (corresponding to the first plates 7 in FIG. 3) electrically connected to the first contacts 43; preferably, the lower plates 50 are composed of a lower portion 50a made of titanium and an upper portion 50b made of platinum. Bands of ferroelectric material 51 run, without gaps, above and between adjacent pairs of lower plates 50, belonging to different pair of cells 27; in addition, the bands of ferroelectric material 51 continuously run above and between the lower plates 50 of adjacent cells in the cross section of FIG. 6, as also shown in the layout of FIG. 7.

Above the bands of ferroelectric material 51, there are first bands of conductive material 52 forming upper plates (corresponding to the second plates 8 in FIG. 3) of the capacitors 3; the first bands of conductive material 52 compose plate lines PL and, as is clear from FIG. 7, have a smaller width compared to the lower plates 50.

Above the first insulating layer 41, there are also formed first contact regions 54, overlying and directly connected to the second contacts 44; the first contact regions 54 are also made preferably using a double layer of titanium and platinum.

A second insulating layer 55 is formed above the first insulating layer 41, covering the first bands of conductive material 52; openings are formed through the second insulating layer 55, into which third contacts 56 run (FIG. 5), directly connected to the first contact regions 54, and openings into which fourth contacts 57 run (FIG. 6), directly connected to the first bands of conductive material 52. Above the second insulating layer 55 metalization lines 60 are formed that define the bit lines BL and are directly connected to the third contacts 56; in addition, second contact regions 61 are formed (FIG. 6) directly connected to the fourth contacts 57. The metalization lines 60 and the second contact regions 61 are formed in the first metalization level.

Above the second insulating layer 55, completely covering the metalization lines 60, there runs a third insulating layer 63, showing openings into which fifth contacts 65 run (FIG. 6) directly connected to the second contact regions 61; above the third insulating layer 63, third contact regions 66 are formed, directly connected to the fifth contacts 65 and made in the second level of metalization, as well as second bands of conductive material 67, connected, in a way not shown, to the word lines forming the gate electrodes 36.

A passivation layer 70 completely covers the device.

Purely by way of example, possible values relative to the regions which compose the ferroelectric cell 1 are given hereinbelow. The area of the capacitor 2 is in the range between 1 and 5 $\mu m^2$; the lower titanium portion 50a of the lower plate is 20 nm thick; the upper platinum portion 50b has a thickness between 100 and 200 nm; the layer of ferroelectric material 51 has a thickness between 50 and 250 nm, and is preferably equal to 100 nm; the first bands of conductive material 52 are approximately 200 nm thick.

The process for manufacturing the ferroelectric cells 1 shown in FIGS. 5–7 is as follows. After having made the transistors 2, having covered with the first insulating layer 41 and having made the first and second contacts 43, 44, in a way known per se, a layer of titanium and then a layer of platinum are made (for example, by sputtering deposition); the lower plates 50 are defined via a first mask (connection of platinum and titanium layers); a layer of ferroelectric material is laid and then a layer of platinum is laid (for example, by sputtering deposition). Then, using a second mask, the first bands of conductive material 52 (connection of platinum layer) are defined and, using a third mask, the bands of ferroelectric material 51 are defined.

The advantages that can be obtained with the present invention are as follows. First of all, the ratio between capacitor 3 area and total cell 1 area is maximized. In fact, the restrictive rules in the cell design must now take into account only the distance between the two lower plates 50 belonging to adjacent pairs of cells 27 and the enclosure between the edges of the lower plate 50 and of the first band of conductive material 52 of each cell.

In addition, critical points in the steps of photolithography and ferroelectric material connection are removed.

Studies by the applicant have shown that the parasitic ferroelectric capacitor formed between two capacitors 3 belonging to two pairs of adjacent cells 27 on the same row does not prejudice the correct operation of the ferroelectric cells 1, given the increased thickness of the dielectric between the two plates 50 and the reduced facing area of the two plates 50 themselves. In addition, the ratio between the active capacitance (capacitance of capacitors 3) and the parasitic capacitance improves with the reduction in thickness of the lower plate 50 and of the layer of ferroelectric material 51 and therefore tends to be reduced with the increase in miniaturization of the devices, expected in the next technological generations.

Finally, it is evident that modifications and variations can be made to the described cell, still remaining within the scope of the present invention.

For example, the layer of ferroelectric material 51 can run over the whole surface of the first insulating layer 41 except for the zones where the first contact regions 54 have to be made (openings 75 in FIG. 5); the materials can differ from those described, as long as they are suitable for the functions required; the exact arrangement of the areas and their dimensions can differ from those described above.

What is claimed is:

1. A process for manufacturing a memory array formed of a large number of stacked cells, comprising:

making a plurality of MOS transistors in respective active areas of a substrate made of semiconductor material, said step of making a plurality of MOS transistors comprising the steps of making, for each one of said MOS transistors, a first and a second conductive region in the substrate and a control electrode;

forming an insulating layer above the substrate;

for each MOS transistor, forming first and second electrical contacts extending through the insulating layer, the first and second electrical contacts being positioned directly above and contacting the first and second conduction regions, respectively;

making a plurality of capacitors, a corresponding one for each one of said MOS transistors, above said active regions, said step of making a plurality of capacitors comprising the steps of making, for each one of said capacitors, a first plate directly above and in contact with the first electrical contact of the corresponding MOS transistor, a dielectric material region above said first plate, and a second plate above said dielectric material region, each of the cells including one of the MOS transistors and a corresponding one of the capacitors;

making a plurality of bit lines connected to said second conductive regions of said MOS transistors by the second contacts; and making a plurality of word lines and a plurality of plate lines running parallel to each other and perpendicular to said bit lines, each word line being connected to respective control electrodes of said MOS transistors and each plate line being connected to respective second plates; wherein said step of making a dielectric material region comprises the step of making a same dielectric region shared by two adjacent cells in a direction parallel to said bit lines, the second plates of the capacitors of the two adjacent cells being spaced apart from each other.

2. The process according to claim 1, wherein making a plurality of capacitors comprises laying a first layer of conductive material; defining said first layer of conductive material to form said first plates of said capacitors; making a layer of dielectric material above said first plates; making a second layer of conductive material above said layer of dielectric material; defining said second layer of conductive material to form said second plates of said capacitors; and defining said layer of dielectric material to form said same shared region.

3. The process according to claim 1, wherein said first plates of said capacitors form lower plates and said same dielectric region runs above and between the lower plates of said two adjacent cells.

4. The process according to claim 3, wherein said same dielectric region runs also on sides not facing each other of said lower plates of said two adjacent cells.

5. The process according to claim 1, further comprising forming a thick oxide layer that separates the MOS transistors of said two adjacent cells, wherein said same dielectric region runs above said thick oxide layer.

6. The process according to claim 1, further comprising shaping said same dielectric region as an elongated band running in parallel to said respective plate lines.

7. The process according to claim 6, further comprising forming upper plates of the capacitors of said two adjacent cells of two bands of conductive material defining respective plate lines and running at a mutual distance above said same dielectric material region.

8. The process according to claim 1, wherein said bit lines run above said capacitors, and said same dielectric region forms a continuous layer except for openings corresponding to said contact regions.

9. The process according to claim 1, wherein said dielectric material region is made of ferroelectric material.

10. A process for forming a memory array, comprising:

forming a first stacked cell by forming a first transistor in a first active region of a semiconductive substrate and forming a first capacitor above the first active region, the first capacitor having a first and a second plate separated by a first dielectric region;

forming a second stacked cell by forming a second transistor in a second active region of the substrate and forming a second capacitor above the second active region, the second capacitor having a first and a second plate separated by a second dielectric region that is continuous with the first dielectric region; and forming a third capacitor having a first and a second plate separated from each other by a third dielectric region that is continuous with the first and second dielectric regions, the first and second capacitors being positioned in a first directional line that is transverse to a second directional line in which the second and third capacitors are positioned.

11. The process of claim 10 wherein each of the first and second transistors includes first and second conductive regions and a control region and the first plates of the first and second capacitors are coupled to the first conductive regions of the first and second transistors, respectively.

12. The process of claim 10 wherein the first dielectric region contacts three sides of the first plate of the first capacitor and the second dielectric region contacts three sides of the first plate of the second capacitor.

13. The process of claim 10 wherein the first and second transistors are separated from each other by a thick oxide layer and the first and second dielectric regions each extend above the thick oxide layer.

14. The process of claim 10, wherein forming the first, second, and third capacitors includes laying a first layer of conductive material; defining said first layer of conductive material to form said first plates of said capacitors; making a layer of dielectric material above said first plates; making a second layer of conductive material above said layer of dielectric material; defining said second layer of conductive material to form said second plates of said capacitors; and defining said layer of dielectric material to form said continuous first, second, and third dielectric regions.

15. The process of claim 10, wherein the first plate is part of a first plate line and the second and third plates are part of a second plate line extending along the second directional line and in parallel with the first plate line, further comprising shaping the first and second dielectric regions as a continuous elongated band running in parallel to the first and second plate lines.

16. The process of claim 10, further comprising forming a bit line connected to a conduction region of one of the first and second transistors, the bit line extending above the first and second capacitors.

17. A process for making a memory array, comprising:
forming a stacked first cell by forming a first transistor first active transition of the substrate and forming a first capacitor above the first active region, the first capacitor having a first and a second plate separated by a first dielectric region;
forming a stacked second cell by forming a second transistor in a second active region of the substrate and forming a second capacitor above the second active region, the second capacitor having a first and a second plate separated by a second dielectric region that is continuous with the first dielectric region;
forming a plurality of plate lines, wherein the second plate of each capacitor is connected to a respective plate line of the plurality of plate lines;
shaping the first and second dielectric regions together as an elongated band extending in parallel to the respective plate lines; and
forming a bit line connected to a conduction region of one of the first and second cells and positioned above the first and second capacitors, wherein the second plates of the first and second capacitors are formed of two bands of conductive material defining respective plate lines and running at a mutual distance above the first and second dielectric regions.

18. A process for making a memory array, comprising:
forming a stacked first cell by forming a first transistor in a first active region of the substrate and forming a first capacitor above the first active region, the first capacitor having a first and a second plate separated by a first dielectric region;
forming a stacked second cell by forming a second transistor in a second active region of the substrate and forming a second capacitor above the second active region, the second capacitor having a first and a second plate separated by a second dielectric region that is continuous with the first dielectric region;
forming a plurality of plate lines, wherein the second plate of each capacitor is connected to a respective plate line of the plurality of plate lines;
shaping the first and second dielectric regions together as an elongated band extending in parallel to the respective plate lines; and
forming a bit line connected to a conduction region of one of the first and second cells and positioned above the first and second capacitors, wherein forming the first and second capacitors comprises laying a first layer of conductive material; defining said first layer of conductive material to form said first plates of said capacitors; making a layer of dielectric material above said first plates; making a second layer of conductive material above said layer of dielectric material; defining said second layer of conductive material to form said second plates of said capacitors; and defining said layer of dielectric material to form said continuous first and second dielectric regions.

19. A process for making a memory array, comprising:
forming a stacked first cell by forming a first transistor in a first active region of the substrate and forming a first capacitor above the first active region, the first capacitor having a first and a second plate separated by a first dielectric region;
forming a stacked second cell by forming a second transistor in a second active region of the substrate and forming a second capacitor above the second active region, the second capacitor having a first and a second plate separated by a second dielectric region that is continuous with the first dielectric region;
forming a plurality of plate lines, wherein the second plate of each capacitor is connected to a respective plate line of the plurality of plate lines;
shaping the first and second dielectric regions together as an elongated band extending in parallel to the respective plate lines; and
forming a bit line connected to a conduction region of one of the first and second cells and positioned above the first and second capacitors, wherein the second plate of the first cell and the second plate of the second cell are discontinuous and parallel to one another.

* * * * *

UNITED STATES PATENT AND TRADEMARK OFFICE
CERTIFICATE OF CORRECTION

PATENT NO. : 6,656,801 B2
DATED : December 2, 2003
INVENTOR(S) : Chiara Corvasce et al.

It is certified that error appears in the above-identified patent and that said Letters Patent is hereby corrected as shown below:

<u>Column 7,</u>
Line 28, "first active transition" should read as-- in a first active region --.

Signed and Sealed this

Twenty-fifth Day of May, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,656,801 B2
DATED : December 2, 2003
INVENTOR(S) : Chiara Corvasce et al.

It is certified that error appears in the above-identified patent and that said Letters Patent is hereby corrected as shown below:

<u>Title page,</u>
Item [62], Related U.S. Application Data, "09/365,178" should read as
-- 09/365,187 --.

Signed and Sealed this

Twenty-seventh Day of July, 2004

JON W. DUDAS
*Acting Director of the United States Patent and Trademark Office*